(12) United States Patent
Lai et al.

(10) Patent No.: US 6,939,804 B2
(45) Date of Patent: *Sep. 6, 2005

(54) FORMATION OF COMPOSITE TUNGSTEN FILMS

(75) Inventors: Ken K. Lai, Milpitas, CA (US); Jeong Soo Byun, Cupertino, CA (US); Frederick C. Wu, Cupertino, CA (US); Ramanujapuran A. Srinivas, San Jose, CA (US); Avgerinos Gelatos, Redwood City, CA (US); Mei Chang, Saratoga, CA (US); Moris Kori, Palo Alto, CA (US); Ashok K. Sinha, Palo Alto, CA (US); Hua Chung, San Jose, CA (US); Hongbin Fang, Mountain View, CA (US); Alfred W. Mak, Union City, CA (US); Michael X. Yang, Fremont, CA (US); Ming Xi, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/299,212

(22) Filed: Nov. 18, 2002

(65) Prior Publication Data

US 2004/0014315 A1 Jan. 22, 2004

Related U.S. Application Data

(63) Continuation of application No. PCT/US02/22585, filed on Jul. 16, 2002.
(60) Provisional application No. 60/306,027, filed on Jul. 16, 2001.

(51) Int. Cl.[7] .............................................. H01L 21/44
(52) U.S. Cl. ........................... 438/680; 117/84; 117/88; 427/255.28; 438/685
(58) Field of Search ...................... 117/84, 88; 427/250, 427/253, 255, 255.1, 255.28, 255.39; 438/648, 680, 681, 685

(56) References Cited

U.S. PATENT DOCUMENTS

| | | | |
|---|---|---|---|
| 5,306,666 A | 4/1994 | Izumi | 437/192 |
| 5,916,365 A | 6/1999 | Sherman | 117/92 |
| 6,042,652 A | 3/2000 | Hyun et al. | 118/719 |

(Continued)

FOREIGN PATENT DOCUMENTS

| | | | |
|---|---|---|---|
| WO | 98/51838 | 11/1998 | C23C/16/06 |
| WO | 00/54320 | 9/2000 | H01L/21/44 |
| WO | 00/70673 | 11/2000 | H01L/21/768 |
| WO | 01/15220 | 3/2001 | H01L/21/768 |
| WO | 01/27346 | 4/2001 | C23C/16/44 |
| WO | 01/27347 | 4/2001 | C23C/16/44 |
| WO | 01/29280 | 4/2001 | C23C/16/32 |
| WO | 01/29891 | 4/2001 | H01L/21/768 |
| WO | 01/29893 | 4/2001 | H01L/21/768 |
| WO | 01/66832 | 9/2001 | C30B/25/14 |
| WO | 02/45167 | 6/2002 | H01L/27/00 |
| WO | 02/067319 | 8/2002 | H01L/21/768 |

OTHER PUBLICATIONS

Yang, et al. "Atomic Layer Deposition of Tungsten Film from $WF_6/B_2H_6$:Nucleation Layer for Advanced Semiconductor Devices" Advanced Metallization Conference, Oct. 8, 2001, pp. 655–660.

(Continued)

*Primary Examiner*—Asok Kumar Sarkar
(74) *Attorney, Agent, or Firm*—Moser Patterson & Sheridan LLP

(57) ABSTRACT

Methods for the deposition of tungsten films are provided. The methods include depositing a nucleation layer by alternatively adsorbing a tungsten precursor and a reducing gas on a substrate, and depositing a bulk layer of tungsten over the nucleation layer.

61 Claims, 10 Drawing Sheets

U.S. PATENT DOCUMENTS

| | | | |
|---|---|---|---|
| 6,139,700 A | 10/2000 | Kang et al. ............. | 204/192.17 |
| 6,156,382 A | 12/2000 | Rajagopalan et al. ........ | 427/250 |
| 6,200,893 B1 | 3/2001 | Sneh ........................... | 438/685 |
| 6,203,613 B1 | 3/2001 | Gates et al. ................ | 117/104 |
| 6,207,487 B1 | 3/2001 | Kim et al. .................. | 438/238 |
| 6,218,298 B1 | 4/2001 | Hoinkis ...................... | 438/675 |
| 6,270,572 B1 | 8/2001 | Kim et al. .................... | 117/93 |
| 6,284,646 B1 | 9/2001 | Leem .......................... | 438/629 |
| 6,287,965 B1 | 9/2001 | Kang et al. ................. | 438/648 |
| 6,305,314 B1 | 10/2001 | Sneh et al. ............. | 118/723 R |
| 6,333,260 B1 | 12/2001 | Kwon et al. ................ | 438/643 |
| 6,342,277 B1 | 1/2002 | Sherman ..................... | 427/562 |
| 6,355,561 B1 | 3/2002 | Sandhu et al. .............. | 438/676 |
| 6,358,829 B2 | 3/2002 | Yoon et al. .................. | 438/597 |
| 6,368,954 B1 | 4/2002 | Lopatin et al. ............. | 438/627 |
| 6,369,430 B1 | 4/2002 | Adetutu et al. ............. | 257/382 |
| 6,372,598 B2 | 4/2002 | Kang et al. ................. | 438/399 |
| 6,391,785 B1 | 5/2002 | Satta et al. ................. | 438/704 |
| 6,399,491 B2 | 6/2002 | Jeon et al. .................. | 438/680 |
| 6,420,189 B1 | 7/2002 | Lopatin ......................... | 438/2 |
| 6,423,619 B1 | 7/2002 | Grant et al. ................ | 438/589 |
| 6,447,933 B1 | 9/2002 | Wang et al. ................. | 428/635 |
| 6,451,119 B2 | 9/2002 | Sneh et al. ................. | 118/715 |
| 6,451,695 B2 | 9/2002 | Sneh .......................... | 438/685 |
| 6,468,924 B2 | 10/2002 | Lee et al. .................... | 438/763 |
| 6,475,276 B1 | 11/2002 | Elers et al. ................... | 117/84 |
| 6,475,910 B1 | 11/2002 | Sneh .......................... | 438/685 |
| 6,482,262 B1 | 11/2002 | Elers et al. ................... | 117/84 |
| 6,482,733 B2 | 11/2002 | Raaijmakers et al. ........ | 438/633 |
| 6,482,740 B2 | 11/2002 | Soininen et al. ............. | 438/686 |
| 6,534,395 B2 | 3/2003 | Werkhoven et al. ......... | 438/627 |
| 6,551,929 B1 | 4/2003 | Kori et al. ................... | 438/685 |
| 6,635,965 B1 | 10/2003 | Lee et al. | |
| 2001/0000866 A1 | 5/2001 | Sneh et al. ............ | 118/723 IR |
| 2001/0002280 A1 | 5/2001 | Sneh et al. ............ | 427/255.28 |
| 2001/0009695 A1 | 7/2001 | Saanila et al. ......... | 427/255.39 |
| 2001/0024387 A1 | 9/2001 | Raaijmakers et al. ........ | 365/200 |
| 2001/0029094 A1 | 10/2001 | Mee-Young et al. ......... | 438/597 |
| 2001/0041250 A1 | 11/2001 | Werkhoven et al. ......... | 428/212 |
| 2001/0054769 A1 | 12/2001 | Raaijmakers et al. ........ | 257/758 |
| 2002/0004293 A1 | 1/2002 | Soininen et al. ............. | 438/584 |
| 2002/0019121 A1 | 2/2002 | Pyo .............................. | 438/618 |
| 2002/0031618 A1 | 3/2002 | Sherman ...................... | 427/569 |
| 2002/0037630 A1 | 3/2002 | Agarwal et al. ............. | 438/430 |
| 2002/0048880 A1 | 4/2002 | Lee .............................. | 438/253 |
| 2002/0055235 A1 | 5/2002 | Agarwal et al. ............. | 438/430 |
| 2002/0061612 A1 | 5/2002 | Sandhu et al. ............... | 438/151 |
| 2002/0076507 A1 | 6/2002 | Chiang et al. ............... | 427/569 |
| 2002/0086507 A1 | 7/2002 | Park et al. ................... | 438/585 |
| 2002/0090829 A1 | 7/2002 | Sandhu et al. ............... | 438/761 |
| 2002/0105088 A1 | 8/2002 | Yang et al. ................... | 257/774 |
| 2002/0106846 A1 | 8/2002 | Seutter et al. ............... | 438/200 |
| 2002/0109168 A1 | 8/2002 | Kim et al. .................... | 257/295 |
| 2002/0117399 A1 | 8/2002 | Chen et al. .................. | 205/125 |
| 2002/0121697 A1 | 9/2002 | Marsh .......................... | 257/751 |
| 2002/0155722 A1 | 10/2002 | Satta et al. ................... | 438/704 |
| 2002/0162506 A1 | 11/2002 | Sneh et al. .................. | 118/715 |
| 2003/0031807 A1 | 2/2003 | Elers et al. .................. | 427/569 |
| 2003/0032281 A1 | 2/2003 | Werkhoven et al. ......... | 438/640 |
| 2003/0049942 A1 | 3/2003 | Haukka et al. .............. | 438/778 |
| 2003/0072975 A1 | 4/2003 | Shero et al. ................. | 428/704 |

OTHER PUBLICATIONS

PCT International Search Report for US/02/22585 dated Aug. 21, 2003. (AMAT/6294PC).

Klaus, et al., "Atomically controlled growth of tungsten and tungsten nitride using sequential surface reactions," Applied Surface Science 162–163 (2000) 479–491.

"Pulsed Nucleation for Ultra–High Aspect Ratio Tungsten Plugfill"; San–Hyeob Lee, et. al; Materials Research Society, 2002, 649–653.

FORMATION OF COMPOSITE TUNGSTEN FILMS

CROSS-REFERENCE TO RELATED APPLICATIONS

This application is a continuation of PCT patent application serial number PCT/US02/22585, filed Jul. 16, 2002, which claims benefit of U.S. provisional patent application Ser. No. 60/306,027, filed Jul. 16, 2001.

BACKGROUND OF THE INVENTION

1. Field of the Invention

Embodiments of the present invention relate generally to a method of tungsten film formation.

2. Description of the Related Art

Reliably producing sub-half micron and smaller features is one of the key technologies for the next generation of very large scale integrated (VLSI) circuits as well as ultra large scale integrated (ULSI) circuits. In particular, as the fringes of integrated circuit technology are pressed, the shrinking dimensions of interconnect features in VLSI and ULSI technology have placed additional demands on processing capabilities to increase both circuit density and the quality of integrated circuits. For example, multi-level interconnect features require careful processing of high aspect ratio structures (the ratio of the feature height to the feature width), such as vias, lines and contacts. It was thought that tungsten (W) could not be extended to sub-half micron features or less; however, efforts are being made to extend the use of tungsten for interconnect metallization in such high aspect ratio structures.

As circuit densities increase, the widths of vias, lines and contacts may decrease to sub-quarter micron dimensions (e.g., less than about 0.2 micrometers), whereas the thickness of the dielectric material layers between such structures typically remains substantially constant, increasing the aspect ratios for such features. Many traditional deposition processes (e.g., chemical vapor deposition (CVD) and physical vapor deposition (PVD)) have difficulty filling sub-micron structures where the aspect ratio exceeds 6:1, and especially where the aspect ratio exceeds 10:1.

FIGS. 1A–1B illustrate the possible consequences of material layer deposition using conventional techniques in a high aspect ratio feature 6 formed on a substrate 1. The high aspect ratio feature 6 may be any opening such as a space formed between adjacent features 2, a contact, a via, or a trench defined in a layer 2. As shown in FIG. 1A, a material layer 11 that is deposited using conventional deposition techniques tends to be deposited on the top edges 6T of the feature 6 at a higher rate than at the bottom 6B or sides 6S thereof, creating an overhang. This overhang or excess deposition of material is sometimes referred to as crowning. Such excess material continues to build up on the top edges 6T of the feature 6, until the opening is closed off by the deposited material 11 forming a void therein. Additionally, as shown in FIG. 1B, a seam 8 may be formed when a material layer 11 deposited on both sides 6S of the opening merge. The presence of either voids or seams may result in unreliable integrated circuit performance.

Therefore, a need exists for a method of depositing tungsten (W) on a substrate to provide void-free and seam-free filling of high aspect ratio openings.

SUMMARY OF THE INVENTION

A method of depositing a composite tungsten (W) film on a substrate is provided. The composite tungsten (W) film comprises a tungsten (W) bulk layer formed on a tungsten (W) nucleation layer. The tungsten nucleation layer may be formed using a cyclical deposition process by alternately adsorbing a tungsten-containing precursor and a reducing gas on the substrate. The tungsten-containing precursor and the reducing gas react to form the tungsten layer on the substrate. The tungsten bulk layer may be formed using a chemical vapor deposition (CVD) process by thermally decomposing a tungsten-containing precursor.

Thus, the present invention provides a method of forming a composite tungsten layer comprising inserting a substrate into a process chamber and introducing a tungsten precursor to the process chamber. The tungsten precursor is allowed to adsorb onto the substrate. Next, a reducing gas is introduced into the process environment and is allowed to adsorb onto the substrate, and, at this point, a tungsten nucleation film is formed on the substrate. The steps of introducing and adsorbing the precursor and reducing gas are repeated until a desired thickness of the tungsten nucleation film layer is formed. Once a desired thickness of nucleation film is achieved, a tungsten bulk layer is then formed on the nucleation layer.

BRIEF DESCRIPTION OF THE DRAWINGS

So that the manner in which the above recited features of the present invention can be understood in detail, a more particular description of the invention, briefly summarized above, may be had by reference to the embodiments thereof which are illustrated in the appended drawings.

It is to be noted, however, that the appended drawings illustrate only certain embodiments of this invention and are therefore not to be considered limiting its scope, for the invention may admit to other equally effective embodiments.

DETAILED DESCRIPTION OF THE PREFERRED EMBODIMENT

Figure 2:
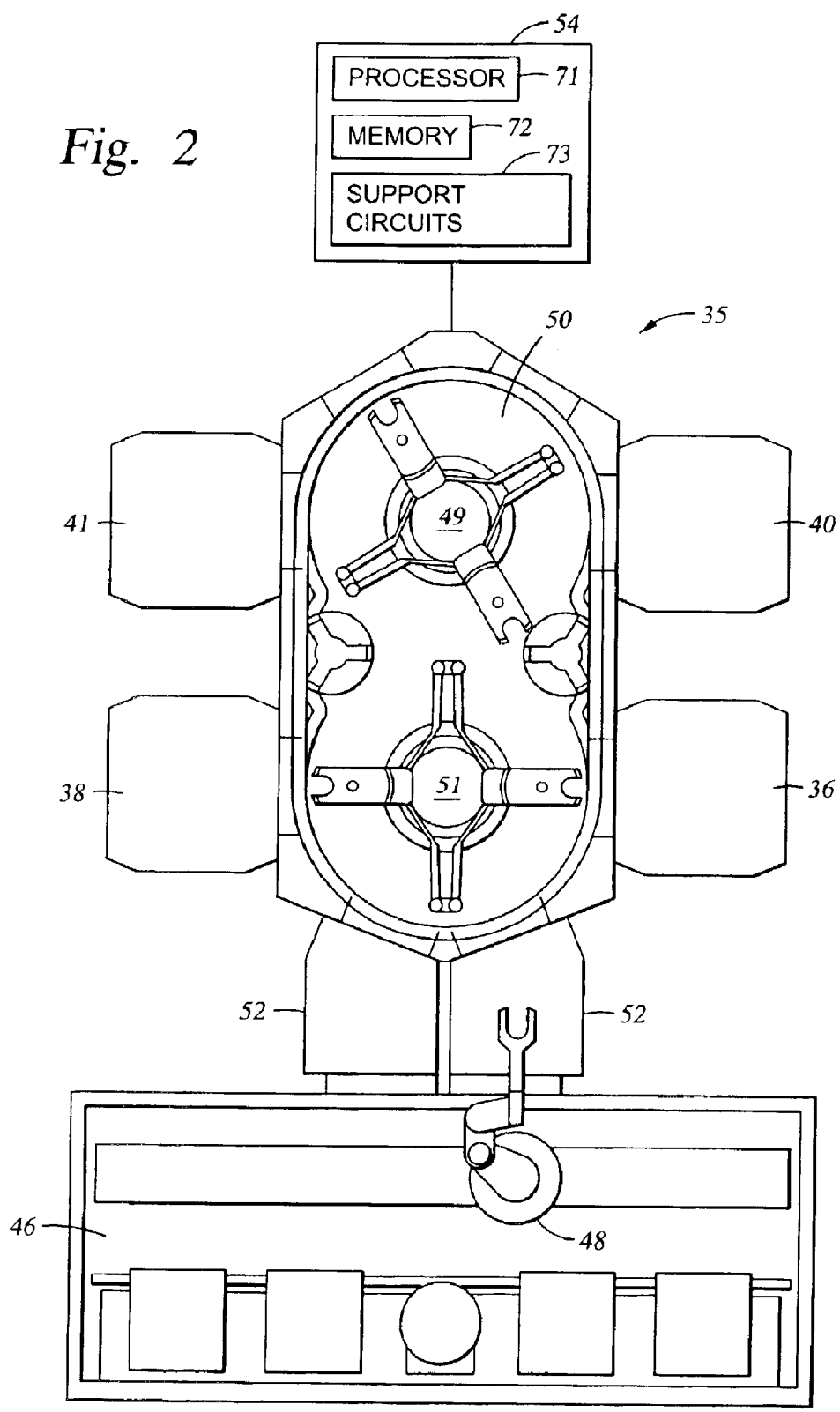
FIG. 2 depicts a schematic illustration of an apparatus that can be used for the practice of embodiments described herein.

FIG. 2 is a schematic representation of a wafer processing system 35 that can be used to perform tungsten deposition in accordance with embodiments described herein. The wafer processing system 35 typically comprises process chambers 36, 38, 40, 41, transfer chamber 50, load-lock chambers 52, a factory interface 46, a microprocessor controller 54, along with other hardware components such as power supplies (not shown) and vacuum pumps (not shown). An example of such a wafer processing system 35 is an ENDURA SL system, available from Applied Materials, Inc., Santa Clara, Calif.

Details of the wafer processing system 35 are described in commonly assigned U.S. patent application Ser. No. 09/451,628, entitled "Integrated Modular Processing Platform", filed on Nov. 30, 1999, which is hereby incorporated herein by reference. The salient features of the wafer processing system 35 are briefly described below.

The wafer processing system 35 includes a transfer chamber 50 containing two transfer robots 49, 51. The transfer chamber 50 is coupled to the factory interface 46 via load-lock chambers 52. Substrates (not shown) are loaded into the wafer processing system 35 through factory interface 46. A factory interface robot 48 moves the substrates from the factory interface 46 into the load-lock chambers 52.

Transfer chamber 50 is coupled to a cluster of process chambers 36, 38, 40, 41. The transfer robots 49, 51 move the substrates between one or more of the process chambers 36, 38, 40, 41.

The process chambers 36, 38, 40, 41 are used to perform various integrated circuit fabrication sequences. For example, process chambers 36, 38, 40, 41 may include cyclical deposition chambers as well as chemical vapor deposition (CVD) chambers, among others.

Figure 3:
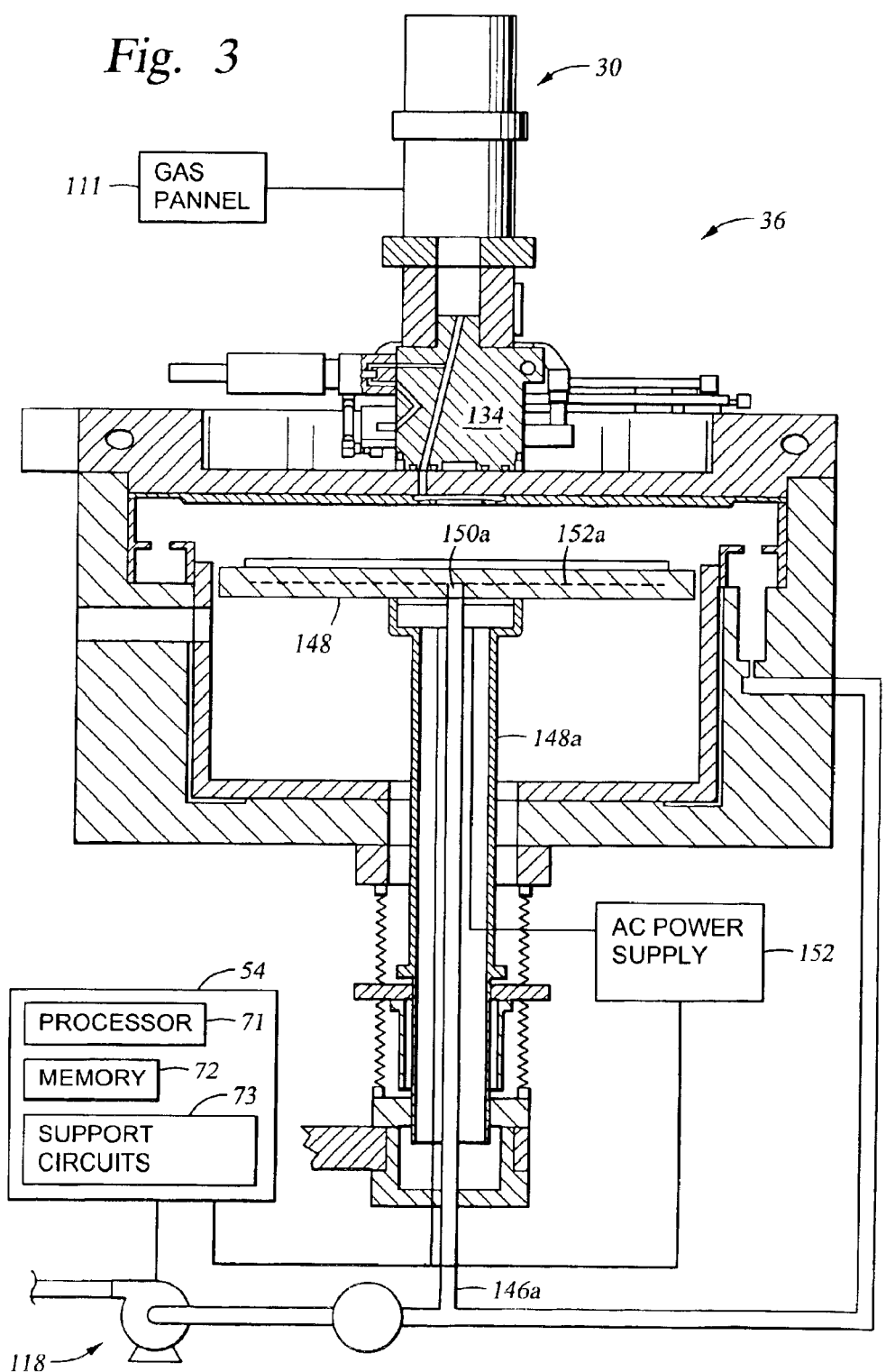
FIG. 3 depicts a schematic cross-sectional view of a process chamber that can be used to perform a cyclical deposition process as described herein.

FIG. 3 depicts a schematic cross-sectional view of a process chamber 36 of wafer processing system 35 that can be used to perform a cyclical deposition process in accordance with embodiments described herein. The process chamber 36 generally houses a wafer support pedestal 148, which is used to support a substrate (not shown). The wafer support pedestal 148 is movable in a vertical direction inside the process chamber 36 using a displacement mechanism 148a.

Depending on the specific process, the substrate can be heated to some desired temperature prior to or during deposition. For example, the wafer support pedestal 148 may be heated using an embedded heater element 152a. The wafer support pedestal 148 may be resistively heated by applying an electric current from an AC power supply 152 to the heater element 152a. The substrate (not shown) is, in turn, heated by the pedestal 148. Alternatively, the wafer support pedestal 148 may be heated using radiant heaters, such as, for example, lamps.

A temperature sensor 150a, such as a thermocouple, is also embedded in the wafer support pedestal 148 to monitor the temperature of the pedestal 148 in a conventional manner. The measured temperature is used in a feedback loop to control the AC power supply 152 for the heating element 152a, such that the substrate temperature can be maintained or controlled at a desired temperature which is suitable for the particular process application.

A vacuum pump 118 is used to evacuate the process chamber 36 and to maintain the pressure inside the process chamber 36. A gas manifold 134, through which process gases are introduced into the process chamber 36, is located above the wafer support pedestal 148. The gas manifold 134 is connected to a gas panel 111, which controls and supplies various process gases to the process chamber 36.

Proper control and regulation of the gas flows to the gas manifold 134 are performed by mass flow controllers (not shown) and a microprocessor controller 170. The gas manifold 134 allows process gases to be introduced and uniformly distributed in the process chamber 36. Additionally, the gas manifold 134 may optionally be heated to prevent condensation of any reactive gases within the manifold.

The gas manifold 134 includes a plurality of electronic control valves (not shown). The electronic control valves as used herein refer to any control valve capable of providing rapid and precise gas flow to the process chamber 36 with valve open and close cycles of less than about 1–2 seconds, and more preferably less than about 0.1 second.

Figure 4:
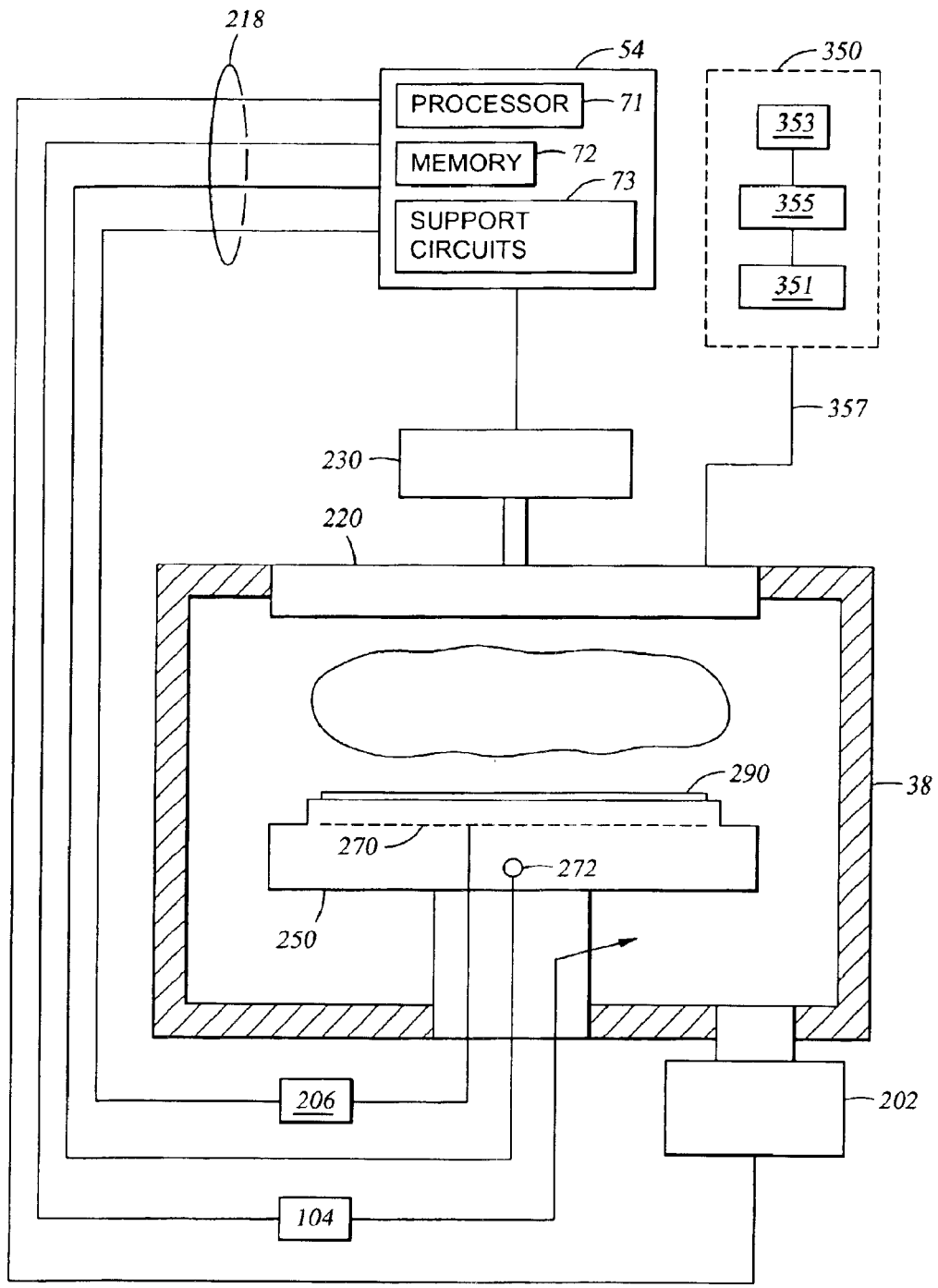
FIG. 4 depicts a schematic cross-sectional view of a process chamber that can be used to perform a chemical vapor deposition (CVD) process described herein.

FIG. 4 depicts a schematic cross-sectional view of a chemical vapor deposition (CVD) process chamber 38 of wafer processing system 35. An example of such a CVD chamber 38 is a WxZ™ chamber, commercially available from Applied Materials, Inc., Santa Clara, Calif.

The CVD chamber 38 generally houses a wafer support pedestal 250, which is used to support a substrate 290. The wafer support pedestal 250 is movable in a vertical direction inside the CVD chamber 38 using a displacement mechanism (not shown).

Depending on the specific CVD process, the substrate 290 can be heated to some desired temperature prior to or during deposition. For example, the wafer support pedestal 250 may be heated by an embedded heater element 270. The wafer support pedestal 250 may be resistively heated by applying an electric current from an AC power supply 206 to the heater element 270. The substrate 290 is, in turn, heated by the pedestal 250. The wafer support pedestal 250 is optionally heated using radiant heat (not shown).

A temperature sensor 272, such as a thermocouple, may also be embedded in the wafer support pedestal 250 to monitor the temperature of the pedestal 250 in a conventional manner. The measured temperature is used in a feedback loop to control the AC power supply 206 for the heating element 270, such that the substrate temperature can be maintained or controlled at a desired temperature which is suitable for the particular process application.

A vacuum pump 202 is used to evacuate the CVD chamber 38 and to maintain the proper gas flows and pressures inside the CVD chamber 38. A showerhead 220, through which process gasses are introduced into the CVD chamber 38, is located above the wafer support pedestal 250. The showerhead 220 is connected to a gas panel 230, which controls and supplies various process gases provided to the CVD chamber 38.

Proper control and regulation of the gas flows through the gas panel 230 are performed by mass flow controllers (not shown) and a microprocessor controller 54. The showerhead 220 allows process gases from the gas panel 230 to be uniformly introduced and distributed in the CVD chamber 38.

The CVD chamber 38 may comprise additional components for enhancing layer deposition on the substrate 290. For example, the showerhead 220 and wafer support pedestal 250 may also form a pair of spaced-apart electrodes. When an electric field is generated between these electrodes, the process gases introduced into the CVD chamber 38 may be ignited into a plasma.

Typically, the electric field is generated by coupling the wafer support pedestal 250 to a source of radio frequency (RF) power (not shown) through a matching network (not shown). Alternatively, the RF power source and matching network may be coupled to the showerhead 220, or coupled to both the showerhead 220 and the wafer support pedestal 250.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Optionally, a remote plasma source 350 may be coupled to the CVD process chamber 38 to provide a remote plasma thereto. The remote plasma source 350 includes a gas supply 353, a gas flow controller 355, a plasma chamber 351, and a chamber inlet 357. The gas flow controller 355 controls the flow of process gas from the gas supply 353 to the plasma chamber 351.

A remote plasma may be generated by applying an electric field to the process gas in the plasma chamber 351, creating a plasma of reactive species. Typically, the electric field is generated in the plasma chamber 351 using an RF power source (not shown). The reactive species generated in the remote plasma source 350 may be introduced into the CVD process chamber 38 through inlet 357.

Process chamber 36 and CVD process chamber 38 as described above are each controlled by a microprocessor controller 54 (FIGS. 2–4). The microprocessor controller 54 may be one of any form of general purpose computer processor (CPU) 71 that can be used in an industrial setting for controlling various chambers and sub-processors. The computer may use any suitable memory 72, such as random access memory, read only memory, floppy disk drive, hard disk, or any other form of digital storage, local or remote. Various support circuits 73 may be coupled to the CPU for supporting the processor in a conventional manner. Software routines as required may be stored in the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

Composite Tungsten Film Formation

A method of forming a composite tungsten (W) film on a substrate is described. The composite tungsten (W) film comprises a tungsten (W) bulk layer formed on a tungsten (W) nucleation layer.

The tungsten (W) nucleation layer may be formed using a cyclical deposition process by alternately adsorbing a tungsten-containing precursor and a reducing gas on the substrate. The tungsten-containing precursor and the reducing gas react to form the tungsten layer on the substrate. The tungsten (W) bulk layer may be formed using a chemical vapor deposition (CVD) process by thermally decomposing a tungsten-containing precursor.

Figure 1A:
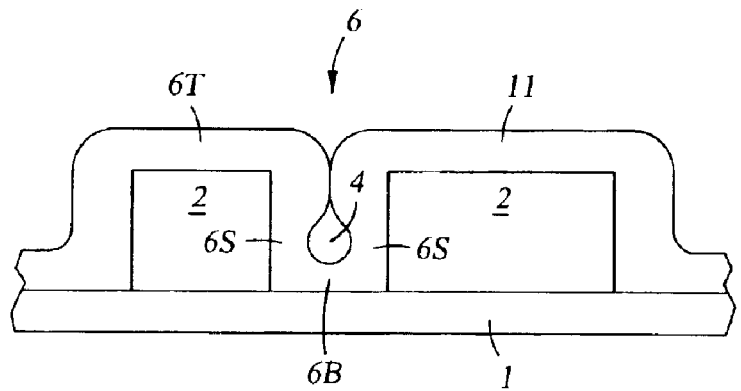
FIGS. 1A–1B are cross-sectional views of undesirable deposition results for high aspect ratio features filled using conventional prior art deposition processes.
Figure 1B:
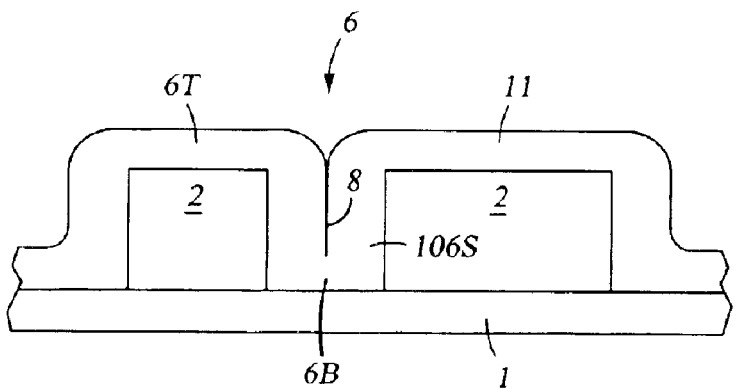
Figure 5:
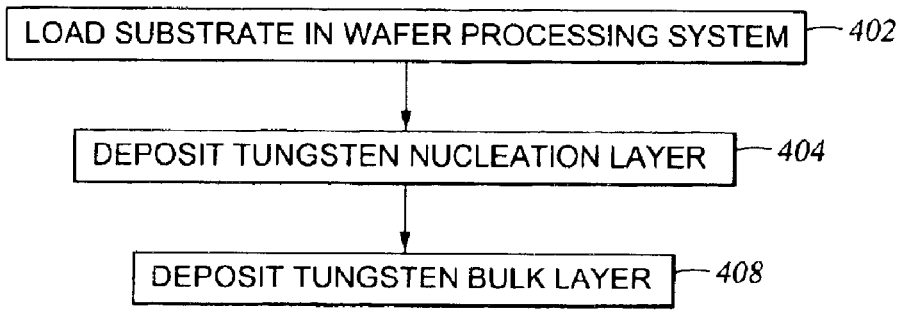
FIG. 5 illustrates a process sequence for tungsten composite film formation.

FIG. 5 illustrates a process sequence 400 detailing the various steps used for the deposition of the composite tungsten (W) film. The steps may be performed in a wafer processing system similar to that described above with reference to FIGS. 2–4. As indicated in step 402, a substrate is introduced into a wafer processing system. The substrate may be, for example, a silicon substrate having a high aspect ratio feature defined in a dielectric material layer.

Referring to step 404, a tungsten (W) nucleation layer is formed on the substrate. The tungsten (W) nucleation layer may be formed in a deposition chamber similar to that described above with respect to FIG. 3. The thickness for the tungsten (W) nucleation layer is variable depending on the device structure to be fabricated. Typically, the thickness for the tungsten (W) nucleation layer is less than about 100 Å, preferably between about 15 Å to about 50 Å.

Figure 6:
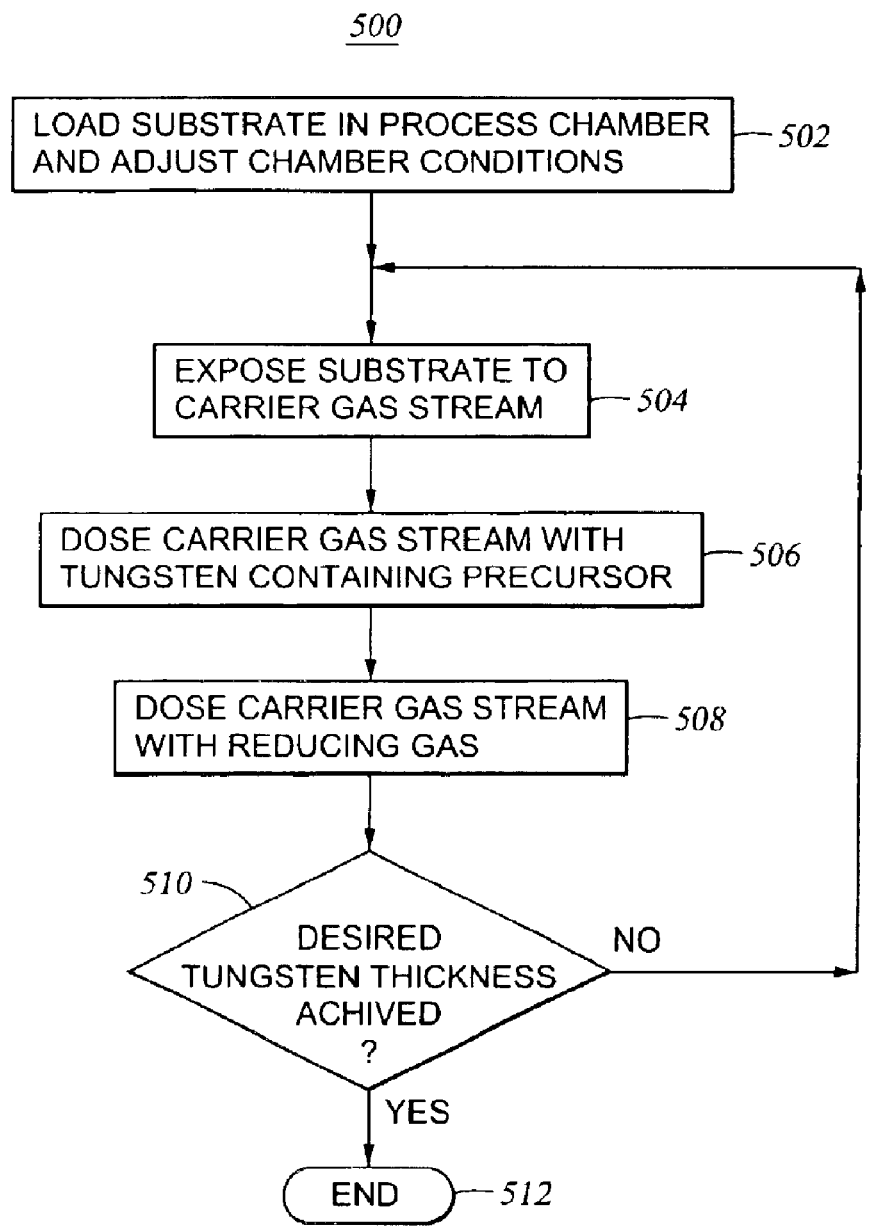
FIG. 6 illustrates a process sequence for tungsten nucleation layer formation using cyclical deposition techniques according to one embodiment described herein.

FIG. 6 illustrates an embodiment of a process sequence 500 according to the present invention detailing the various steps needed for the deposition of the tungsten (W) nucleation layer utilizing a constant carrier gas flow. As shown in step 502, a substrate is introduced into a process chamber. The substrate may be, for example, a silicon substrate ready for tungsten plug formation during an integrated circuit fabrication process. The process chamber conditions such as, for example, the temperature and pressure are adjusted to enhance the adsorption of the process gases on the substrate. In general, for tungsten (W) nucleation layer deposition, the substrate should be maintained at a temperature between about 200° C. and about 500° C. at a process chamber pressure of between about 1 torr and about 10 torr.

In one embodiment where a constant carrier gas flow is desired, a carrier gas stream is established within the process chamber, as indicated in step 504. Carrier gases may be selected so as to also act as a purge gas for removal of volatile reactants and/or by-products from the process chamber. Carrier gases such as, for example, helium (He), argon (Ar), nitrogen ($N_2$) and hydrogen ($H_2$), and combinations thereof, among others may be used.

Referring to step 506, after the carrier gas stream is established within the process chamber, a pulse of a tungsten-containing precursor is added to the carrier gas stream. The term pulse as used herein refers to a dose of material injected into the process chamber or into the carrier gas stream. The pulse of the tungsten-containing precursor lasts for a predetermined time interval. The tungsten-containing precursor may comprise, for example, tungsten hexafluoride ($WF_6$) or tungsten carbonyl ($W(CO)_6$), among others.

The time interval for the pulse of the tungsten-containing precursor is variable depending upon a number of factors such as, for example, the volume capacity of the process chamber employed, the vacuum system coupled thereto and the volatility/reactivity of the reactants used. In general, the process conditions are advantageously selected so that at least a monolayer of the tungsten-containing precursor is adsorbed on the substrate. Thereafter, excess tungsten-containing precursor remaining in the chamber may be removed from the process chamber by the constant carrier gas stream in combination with the vacuum system.

In step 508, after the excess tungsten-containing precursor has been sufficiently removed from the process chamber by the carrier gas stream to prevent co-reaction or particle formation with a subsequently provided process gas, a pulse of a reducing gas is added to the carrier gas stream. Suitable reducing gases may include, for example, silane ($SiH_4$), disilane ($Si_2H_6$), dichlorosilane ($SiCl_2H_2$), borane ($BH_3$), diborane ($B_2H_6$), triborane, tetraborane, pentaborane, hexaborane, heptaborane, octaborane, nanoborane and decaborane, among others.

The pulse of the reducing gas also lasts for a predetermined time interval. In general, the time interval for the pulse of the reducing gas should be long enough to provide a sufficient amount of the reducing gas for reaction with the tungsten-containing precursor that is already adsorbed on the substrate. Thereafter, excess reducing gas is flushed from the process chamber by the carrier gas stream in combination with the vacuum system.

Steps 504 through 508 comprise one embodiment of a deposition cycle for the tungsten (W) nucleation layer. For such an embodiment, a constant flow of the carrier gas is provided to the process chamber modulated by alternating periods of pulsing and non-pulsing where the periods of pulsing alternate between the tungsten-containing precursor and the reducing gas along with the carrier gas stream, while the periods of non-pulsing include only the carrier gas stream.

The time interval for each of the pulses of the tungsten-containing precursor and the reducing gas may have the same duration. That is, the duration of the pulse of the tungsten-containing precursor may be identical to the duration of the pulse of the reducing gas. For such an embodiment, a time interval ($T_1$) for the pulse of the tungsten-containing precursor is equal to a time interval ($T_2$) for the pulse of the reducing gas.

Alternatively, the time interval for each of the pulses of the tungsten-containing precursor and the reducing gas may have different durations. That is, the duration of the pulse of the tungsten-containing precursor may be shorter or longer than the duration of the pulse of the reducing gas. For such an embodiment, the time interval ($T_1$) for the pulse of the tungsten-containing precursor is different than the time interval ($T_2$) for the pulse of the reducing gas.

In addition, the periods of non-pulsing between each of the pulses of the tungsten-containing precursor and the reducing gas may have the same duration. That is, the duration of the period of non-pulsing between each pulse of the tungsten-containing precursor and each pulse of the reducing gas may be identical. For such an embodiment, a time interval ($T_3$) of non-pulsing between the pulse of the tungsten-containing precursor and the pulse of the reducing gas is equal to a time interval ($T_4$) of non-pulsing between the pulse of the reducing gas and the pulse of the tungsten-containing precursor. During the time periods of non-pulsing only the constant carrier gas stream is provided to the process chamber.

Alternatively, the periods of non-pulsing between each of the pulses of the tungsten-containing precursor and the reducing gas may have different durations. That is, the duration of the period of non-pulsing between each pulse of the tungsten-containing precursor and each pulse of the reducing gas may be shorter or longer than the duration of the period of non-pulsing between each pulse of the reducing gas and each pulse of the tungsten-containing precursor. For such an embodiment, a time interval ($T_3$) of non-pulsing between the pulse of the tungsten-containing precursor and the pulse of the reducing gas is different from a time interval ($T_4$) of non-pulsing between the pulse of the reducing gas and the pulse of the tungsten-containing precursor. During the periods of non-pulsing only the constant carrier gas stream is provided to the process chamber.

Additionally, the time intervals for each pulse of the tungsten-containing precursor, the reducing gas and the periods of non-pulsing therebetween for each deposition cycle may have the same duration. For example, in a first deposition cycle ($C_1$), a time interval ($T_1$) for the pulse of the tungsten-containing precursor may have the same duration as the time interval ($T_1$) for the pulse of the tungsten-containing precursor in subsequent deposition cycles ($C_2 \ldots C_N$). Similarly, the duration of each pulse of the reducing gas as well as the periods of non-pulsing between the pulse of the tungsten-containing precursor and the reducing gas in the first deposition cycle ($C_1$) may have the same as the duration of each pulse of the reducing gas and the periods of non-pulsing between the pulse of the tungsten-containing precursor and the reducing gas in subsequent deposition cycles ($C_2 \ldots C_N$), respectively.

Alternatively, the time intervals for at least one pulse of the tungsten-containing precursor, the reducing gas and the periods of non-pulsing therebetween for one or more of the deposition cycles of the tungsten deposition process may have different durations. For example, in a first deposition cycle ($C_1$), the time interval ($T_1$) for the pulse of the tungsten-containing precursor may be longer or shorter than the time interval ($T_1$) for the pulse of the tungsten-containing precursor in subsequent deposition cycles ($C_2 \ldots C_N$). Similarly, the duration of each pulse of the reducing gas and the periods of non-pulsing between the pulse of the tungsten-containing precursor and the reducing gas in deposition cycle ($C_1$) may be the same or different than the duration of corresponding pulses of the reducing gas and the periods of non-pulsing between the pulse of the tungsten-containing precursor and the reducing gas in subsequent deposition cycles ($C_2 \ldots C_N$), respectively.

Referring to step 510, after each deposition cycle (steps 504 through 508) a thickness of tungsten will be formed on the substrate. Depending on specific device requirements, subsequent deposition cycles may be needed to achieve a desired thickness. As such, steps 504 through 508 are repeated until the desired thickness for the tungsten nucleation layer is achieved. Thereafter, when the desired thickness for the tungsten nucleation layer is achieved the process is stopped as indicated by step 512.

Figure 7:
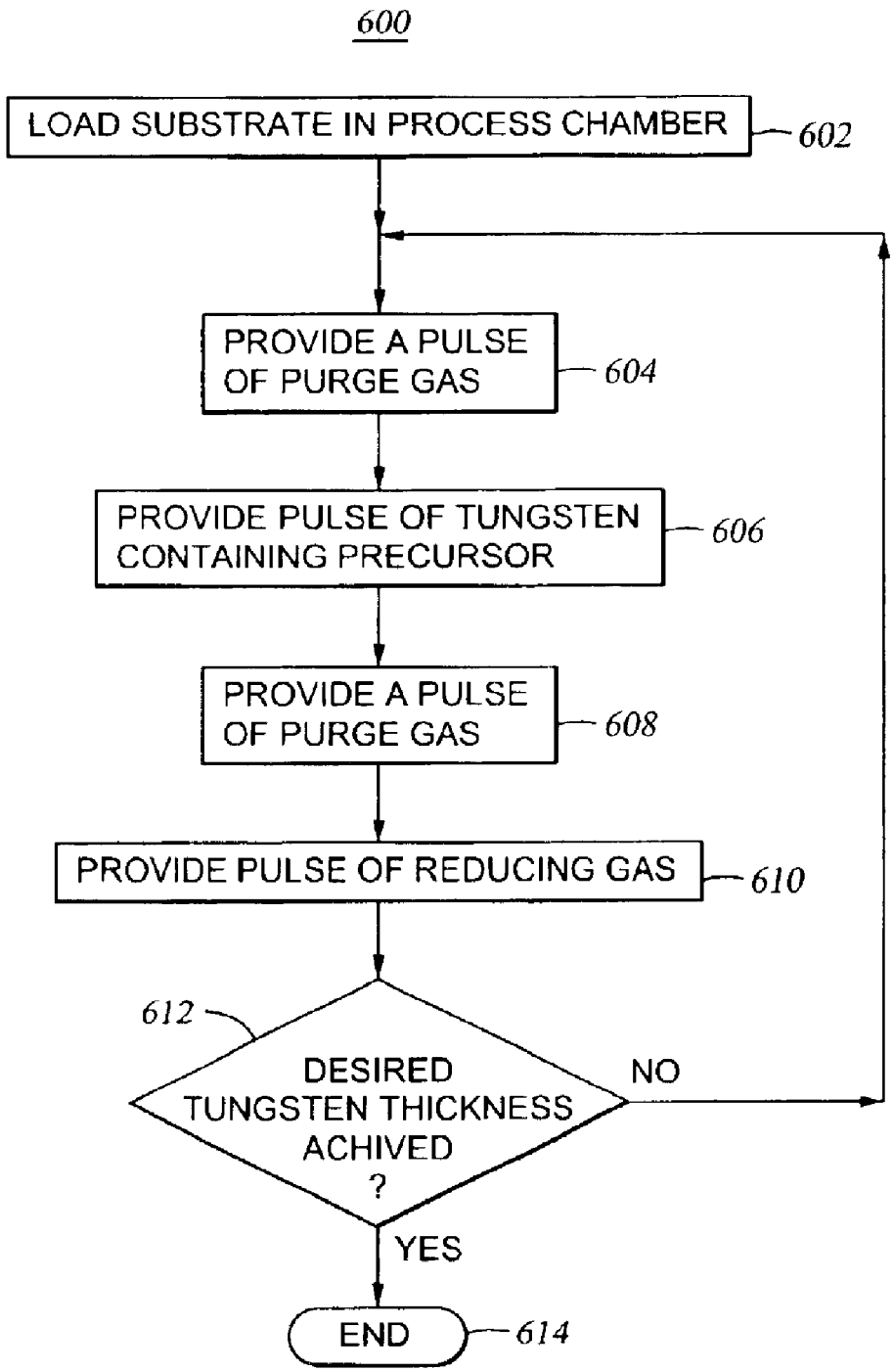
FIG. 7 illustrates a process sequence for tungsten nucleation layer formation using cyclical deposition techniques according to an alternate embodiment described herein.

In an alternate process sequence described with respect to FIG. 7, the tungsten nucleation layer deposition cycle comprises separate pulses for each of the tungsten-containing precursor, the reducing gas and the purge gas. For such an embodiment, a tungsten nucleation layer deposition sequence 600 includes introducing a substrate into the process chamber (step 602), providing a pulse of a purge gas to the process chamber (step 604), providing a pulse of a tungsten-containing precursor to the process chamber (step 606), providing a pulse of a purge gas to the process chamber (step 608), providing a pulse of the reducing gas to the process chamber (step 610), and then repeating steps 604 through 608, or stopping the deposition process (step 614) depending on whether a desired thickness for the tungsten nucleation layer has been achieved (step 612).

The time intervals for each of the pulses of the tungsten-containing precursor, the reducing gas and the purge gas may have the same or different durations as discussed above with respect to FIG. 6. Alternatively, corresponding time intervals for one or more pulses of the tungsten-containing precursor, the reducing gas and the purge gas in one or more of the deposition cycles of the tungsten nucleation layer deposition process may have different durations.

In FIGS. 6–7, the tungsten nucleation layer deposition cycle is depicted as beginning with a pulse of the tungsten-containing precursor followed by a pulse of the reducing gas. Alternatively, the tungsten nucleation layer deposition cycle may start with a pulse of the reducing gas followed by a pulse of the tungsten-containing precursor. In addition, a pulse may comprise one injection of gas or several short, sequential injections.

One exemplary process of depositing a tungsten nucleation layer comprises sequentially providing pulses of tungsten hexafluoride ($WF_6$) and pulses of diborane ($B_2H_6$). The tungsten hexafluoride ($WF_6$) may be provided to an appropriate flow control valve, for example, an electronic control valve, at a flow rate of between about 10 sccm (standard cubic centimeters per minute) to about 400 sccm, preferably between about 20 sccm and about 100 sccm, and thereafter pulsed for about 1 second or less, preferably about 0.2 seconds or less. A carrier gas comprising argon is provided along with the tungsten hexafluoride ($WF_6$) at a flow rate of between about 250 sccm to about 1000 sccm, preferably between about 500 sccm to about 750 sccm. The diborane ($B_2H_6$) may be provided to an appropriate flow control valve, for example, an electronic control valve, at a flow rate of between about 5 sccm and about 150 sccm, preferably between about 5 sccm and about 25 sccm, and thereafter pulsed for about 1 second or less, preferably about 0.2 seconds or less. A carrier gas comprising argon is provided along with the diborane at a flow rate between about 250 sccm to about 1000 sccm, preferably between about 500 sccm to about 750 sccm. The substrate may be maintained at a temperature between about 250° C. to about 350° C. at a chamber pressure between about 1 torr to about 10 torr, preferably at about 5 torr.

Another exemplary process of depositing a tungsten nucleation layer comprises sequentially providing pulses of tungsten hexafluoride ($WF_6$) and pulses of silane ($SiH_4$). The tungsten hexafluoride ($WF_6$) may be provided to an appropriate flow control valve, for example, an electronic control valve at a flow rate of between about 10 sccm to about 400 sccm, preferably between about 20 sccm and about 100 sccm, and thereafter pulsed for about 1 second or less, preferably about 0.2 seconds or less. A carrier gas comprising argon (Ar) is provided along with the tungsten hexafluoride ($WF_6$) at a flow rate between about 250 sccm to about 1000 sccm, preferably between about 300 sccm to about 500 sccm. The silane ($SiH_4$) may be provided to an appropriate flow control valve, for example, an electronic control valve, at a flow rate between about 10 sccm to about 500 sccm, preferably between about 50 sccm to about 200 sccm, and thereafter pulsed for about 1 second or less, preferably about 0.2 seconds or less. A carrier gas comprising argon (Ar) may be provided along with the silane ($SiH_4$) at a flow rate between about 250 sccm to about 1000 sccm, preferably between about 300 sccm to about 500 sccm. A pulse of a purge gas comprising argon (Ar) at a flow rate between about 300 sccm to about 1000 sccm, preferably between about 500 sccm to about 750 sccm, in pulses of about 1 second or less, preferably about 0.3 seconds or less, is provided between the pulses of the tungsten hexafluoride ($WF_6$) and the pulses of the silane ($SiH_4$). The substrate may be maintained at a temperature between about 300° C. to about 400° C. at a chamber pressure between about 1 torr to about 10 torr.

Referring to step 406 in FIG. 5, after the tungsten nucleation layer is formed on the substrate, a tungsten bulk layer is formed thereover. The tungsten bulk layer may be formed in a CVD process chamber similar to that described above with respect to FIG. 4. The thickness for the tungsten bulk layer is variable depending on the device structure to be fabricated. Typically, the thickness for the tungsten bulk layer is between about 300 Å to about 1500 Å.

One exemplary process of depositing a tungsten bulk layer comprises thermally decomposing a tungsten-containing precursor, such as, for example, tungsten hexafluoride ($WF_6$). The tungsten hexafluoride ($WF_6$) may be provided at a flow rate of between about 10 sccm and about 400 sccm, preferably between about 200 sccm and about 250 sccm. A carrier gas such as for example, argon (Ar), may be provided along with the tungsten hexafluoride ($WF_6$) at a flow rate between about 250 sccm to about 1000 sccm, preferably between about 300 sccm to about 650 sccm. The substrate may be maintained at a temperature between about 450° C. to about 600° C. at a chamber pressure between about 10 torr to about 30 torr. The above process parameters provide a deposition rate for the tungsten bulk layer in a range of about 10 Å/min to about 50 Å/min. Other CVD process chambers are within the scope of the invention, and the parameters listed above may vary according to the particular process chamber used.

Figure 8A:
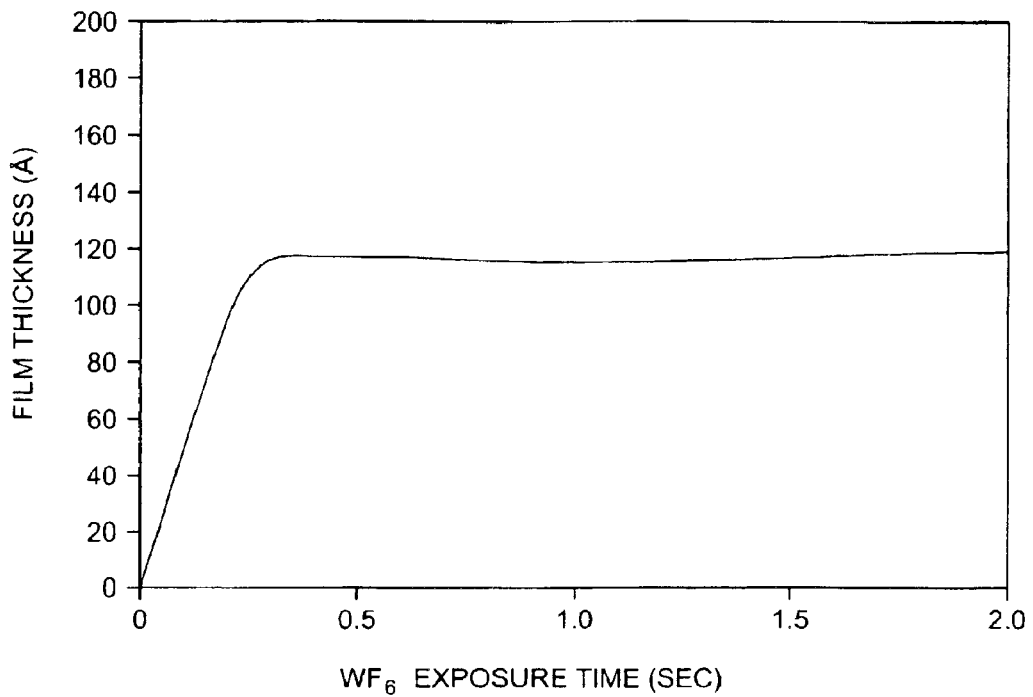
FIGS. 8A–8B are graphs of the tungsten film thickness plotted as a function of the pulse time for the tungsten-containing precursor and the reducing gas.

The deposition rate for a tungsten nucleation layer formed using a cyclical deposition process may vary as a function of the pulse time of the tungsten hexafluoride ($WF_6$). Referring to FIG. 8A, the deposition rate for the tungsten nucleation layer is about 1.1 Å/cycle (110 Å/100 cycles) for a tungsten hexafluoride ($WF_6$) pulse of 0.3 seconds. The deposition rate for the tungsten nucleation layer falls to about 0.3 Å/cycle (30 Å/100 cycles) for a tungsten hexafluoride ($WF_6$) pulse time of 0.1 second. Additionally, for tungsten hexafluoride ($WF_6$) pulse times greater than about 0.3 seconds, the deposition rate of the tungsten remains at about 1.1 Å/cycle.

Figure 8B:
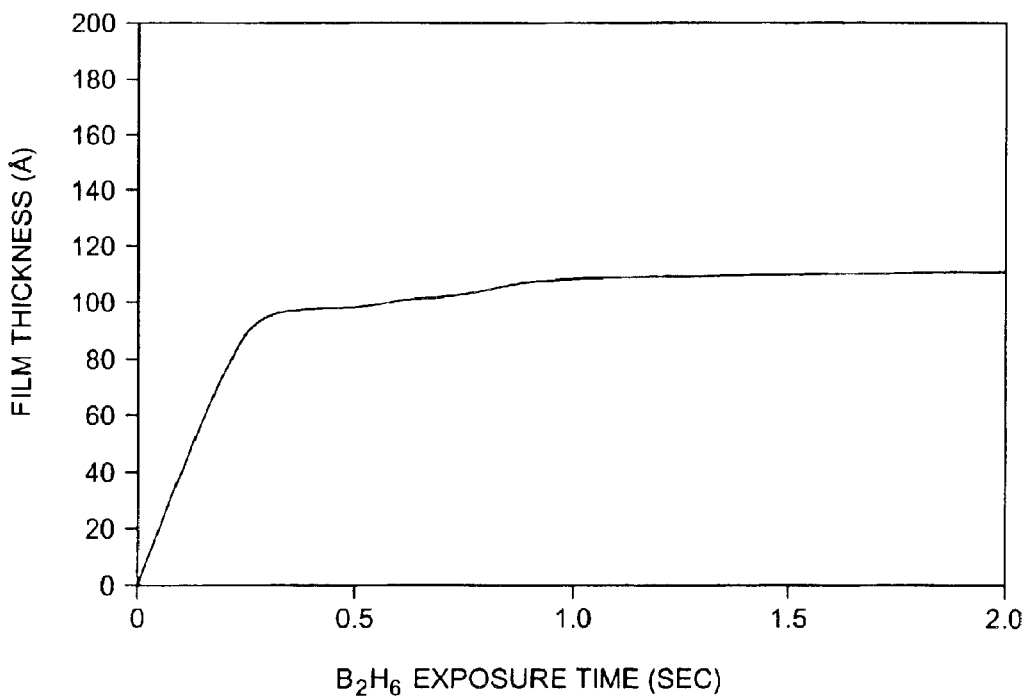

The deposition rate for a tungsten nucleation layer formed using a cyclical deposition process may vary as a function of the pulse time of the diborane ($B_2H_6$). Referring to FIG. 8B, the deposition rate for the tungsten nucleation layer is about 0.9 Å/cycle (90 Å/100 cycles) for a diborane ($B_2H_6$) pulse time of 0.3 seconds. The deposition rate for the tungsten nucleation layer falls to about 0.25 Å/cycle (25 Å/100 cycles) for a diborane ($B_2H_6$) pulse time of 0.1 second. Additionally, for diborane pulse times of greater than about 0.3 seconds, the deposition rate of the tungsten remains at about 1.0 Å/cycle.

Figure 9A:
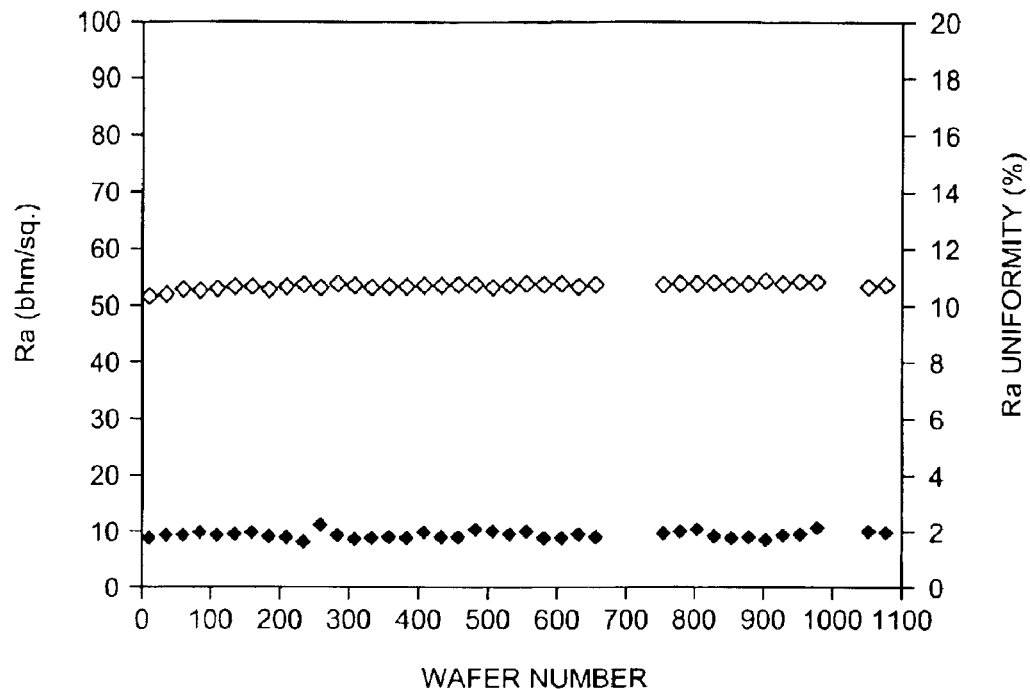
FIGS. 9A–9B are graphs of the tungsten (W) nucleation layer sheet resistance uniformity.
Figure 9B:
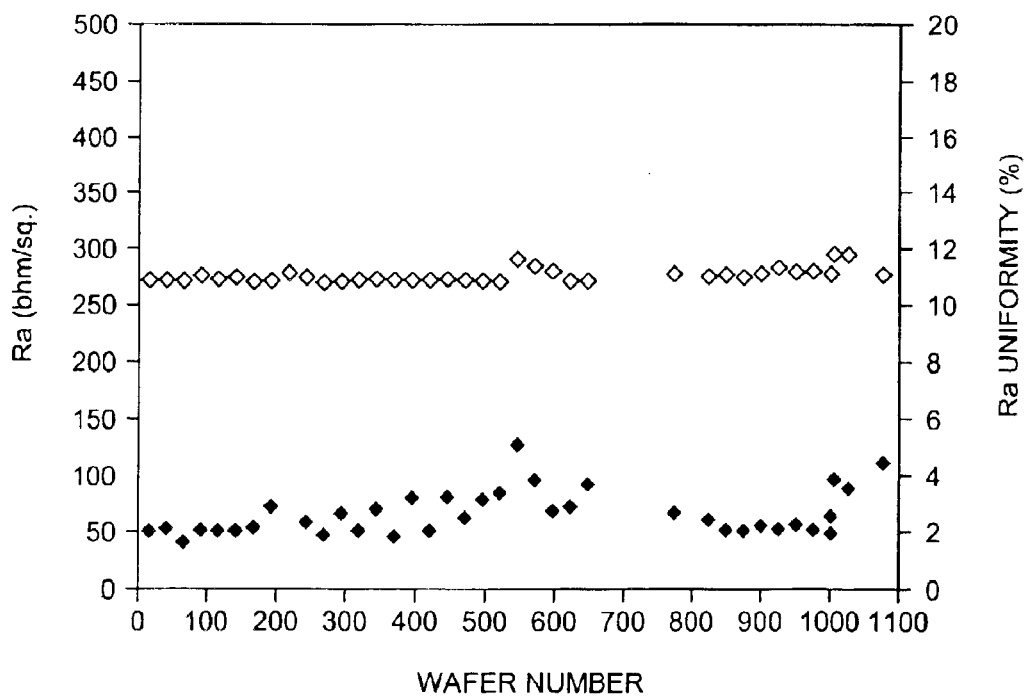

FIGS. 9A–9B are graphs of the sheet resistance uniformity for tungsten nucleation layers formed using a cyclical deposition process. Referring to FIG. 9A, the sheet resistance of 1100 wafers each having a 250 Å tungsten film deposited thereon using a cyclical deposition process were measured. The 1100 wafers had an average sheet resistance of 53.48±0/87% and an average sheet resistance uniformity of 1.85%; meaning that from wafer to wafer the sheet resistance of the 250 Å tungsten film differed by less than 1.85%. Referring to FIG. 9B, the sheet resistance of 1100 wafers each having a 55 Å tungsten film deposited thereon using a cyclical deposition process were also measured. The 1100 wafers had an average sheet resistance of 276.8±2.33% and an average sheet resistance uniformity of 2.70%; meaning that from wafer to wafer the sheet resistance of the 55 Å tungsten film differed by less than 2.70%.

Figure 10A:
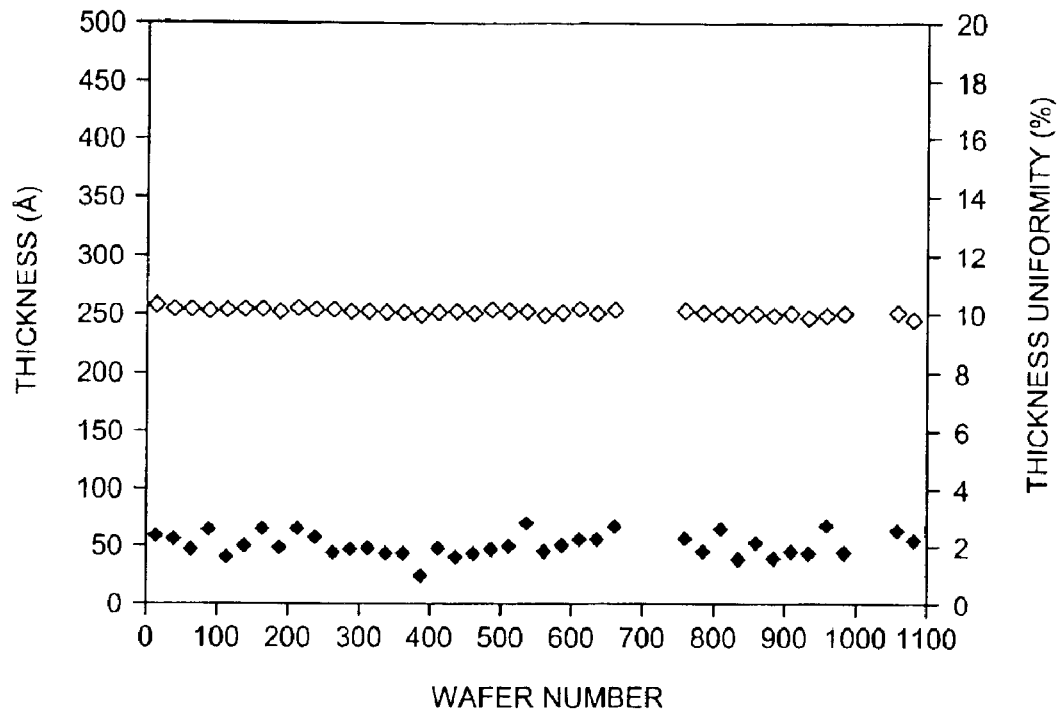
FIGS. 10A–10B are graphs of the tungsten (W) nucleation layer thickness uniformity.
Figure 10B:
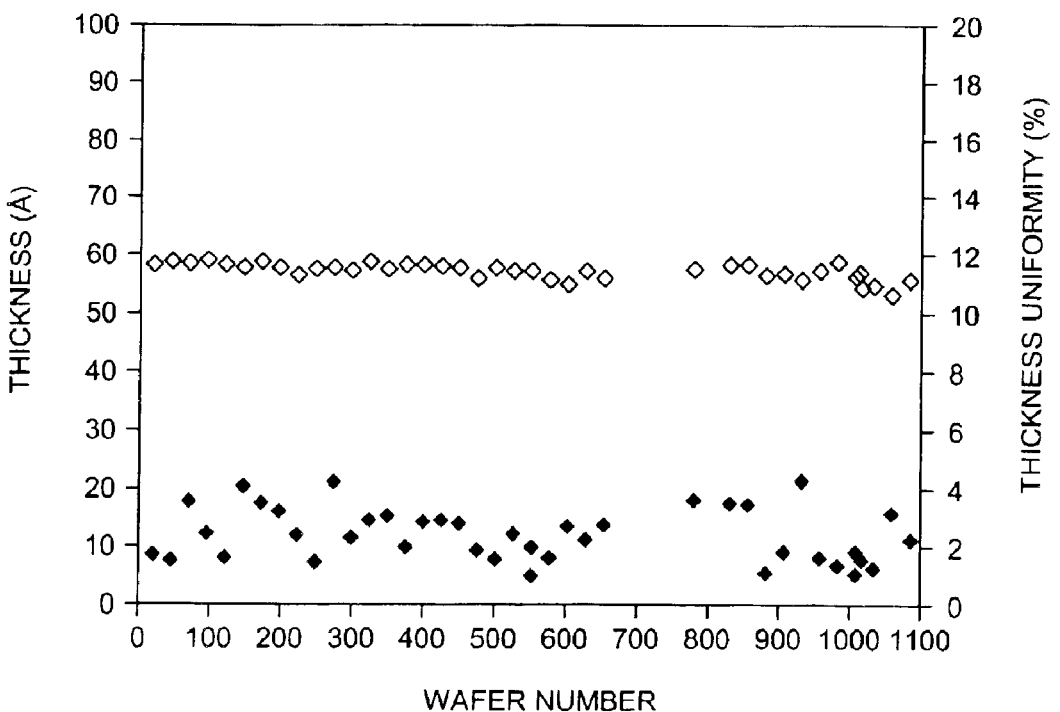

FIGS. 10A–10B are graphs of the film thickness uniformity for tungsten nucleation layers formed using a cyclical deposition process. Referring to FIG. 10A, the film thickness of 1100 wafers each having a 250 Å tungsten layer deposited thereon using a cyclical deposition process were measured. The 1100 wafers had an average film thickness of 253 Å±0.93% and an average thickness uniformity of 1.92%; meaning that from wafer to wafer the thickness of the 250 Å tungsten film differed by less than 1.92%. Referring to FIG, 10B, the film thickness of 1100 wafers each having a 55 Å tungsten film deposited thereon using a cyclical deposition process was also measured. The 1100 wafers had an average film thickness of 58.6±2.5% and an average thickness uniformity of 2.47%; meaning that from wafer to wafer the sheet resistance of the 55 Å tungsten film differed by less than 2.47%.

Integrated Circuit Fabrication Process

Figure 11A:
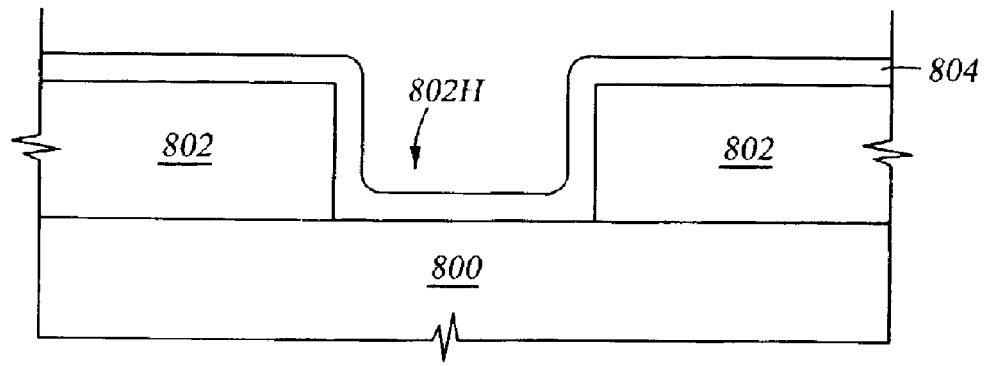
FIGS. 11A–11B illustrate schematic cross-sectional views of an integrated circuit at different stages of an interconnect fabrication process.
Figure 11B:
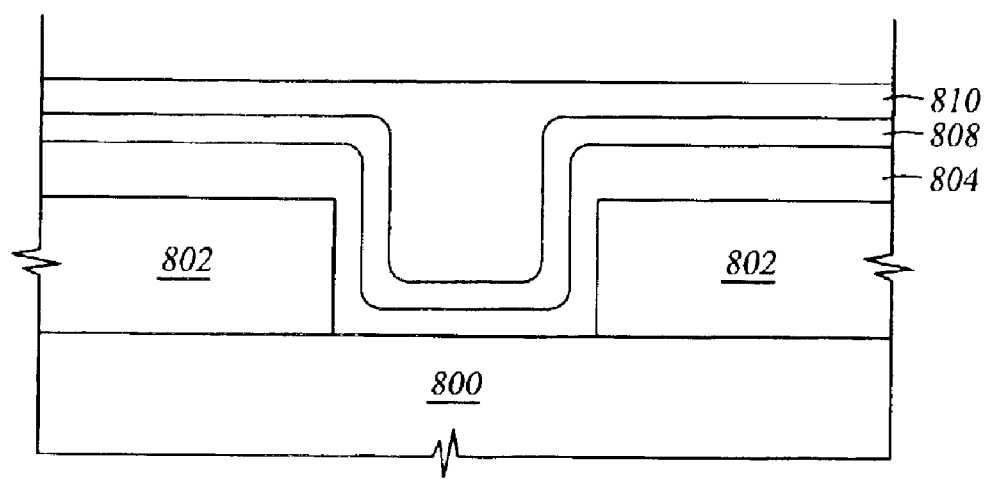

FIGS. 11A–11B illustrate cross-sectional views of a substrate at different stages of fabrication process incorporating the composite tungsten film of the present invention as interconnect metallization. FIG. 11A, for example, illustrates a cross-sectional view of a substrate 800 having a dielectric layer 802 formed thereon. The substrate 800 may comprise a semiconductor material such as, for example, silicon (Si), germanium (Ge), or gallium arsenide (GaAs). The dielectric material may comprise an insulating material such as, for example, silicon oxide or silicon nitride. The dielectric layer 802 has at least one aperture 802H formed therein. The at least one aperture 802H may be formed using conventional lithography and etching techniques.

The at least one aperture 802H may have a barrier layer 804 thereon. The barrier layer 804 may comprise for example, titanium nitride (TiN) or tantalum nitride (TaN), among others. The barrier layer 804 may be formed using conventional deposition techniques.

Referring to FIG. 11B, a composite tungsten film 806 comprising a tungsten nucleation layer 808 and a tungsten bulk layer 810 are used to fill the at least one aperture 802H. The composite tungsten film 806 is formed using the deposition techniques described above with respect to FIGS. 5–7.

While foregoing is directed to the preferred embodiment of the present invention, other and further embodiments of the invention may be devised without departing from the basic scope thereof, and the scope thereof is determined by the claims that follow.

What is claimed is:

1. A method of forming a composite tungsten film, comprising:
   introducing a substrate having at least one aperture into a process environment;
   providing a tungsten-containing precursor to the process environment;
   adsorbing the tungsten-containing precursor on the substrate;
   providing a reducing gas to the process environment;
   adsorbing the reducing gas onto the substrate, wherein a tungsten nucleation layer is formed on the substrate and within the at least one aperture;
   repeating the providing and adsorbing steps until the tungsten nucleation layer is formed with a desired thickness; and
   forming a tungsten bulk layer on the tungsten nucleation layer within the at least one aperture by a chemical vapor deposition process, comprising:
      maintaining the substrate within a temperature range to thermally deposit the tungsten bulk layer;
      exposing the substrate to a steady flow of a process gas containing a second tungsten-containing precursor, and
      depositing the tungsten bulk layer to fill the at least one aperture free of voids and seams.

2. The method of claim 1, wherein the tungsten-containing precursor is tungsten hexafluoride or tungsten carbonyl.

3. The method of claim 2, wherein the tungsten-containing precursor is provided at a flow rate in a range from about 10 sccm to about 400 sccm.

4. The method of claim 1, wherein the tungsten-containing precursor is provided at a duration of less than 1 second.

5. The method of claim 4, wherein the duration is less than 0.2 seconds.

6. The method of claim 1, wherein the reducing gas is selected from the group consisting of silane, disilane, dichlorosilane, borane, diborane, triborane, tetraborane, and pentaborane.

7. The method of claim 6, wherein the reducing gas is diborane.

8. The method of claim 7, wherein the diborane is provided at a flow rate in a range from about 5 sccm to about 150 sccm.

9. The method of claim 6, wherein the reducing gas is silane.

10. The method of claim 9, wherein the silane is provided at a flow rate in a range from about 10 sccm to about 500 sccm.

11. The method of claim 6, wherein the reducing gas is provided at a duration of less than 1 second.

12. The method of claim 11, wherein the duration is less than 0.2 seconds.

13. The method of claim 1, further comprising flowing a carrier gas through the process environment.

14. The method of claim 13, wherein the carrier gas is selected from the group consisting of helium, argon, nitrogen or hydrogen.

15. The method of claim 14, wherein the process environment comprises a temperature in a range from about 200° C. to about 500° C.

16. The method of claim 15, wherein the process environment comprises a pressure in a range from about 1 Torr to about 10 Torr.

17. The method of claim 1, further comprising a purge step before one or both providing steps.

18. The method of claim 17, wherein the purge step comprises pulsing a purge gas into the process environment.

19. The method of claim 18, wherein the purge gas is selected from the group consisting of helium, argon, nitrogen or hydrogen.

20. The method of claim 19, wherein the purge gas is provided at a flow rate in a range from about 300 sccm to about 1,000 sccm.

21. The method of claim 18, wherein the pulse has a duration of less than 2 seconds.

22. The method of claim 21, wherein the duration is less than 1 second.

23. The method of claim 22, wherein the duration is about 0.3 seconds.

24. The method of claim 1, wherein the desired thickness of the tungsten nucleation layer is about 100 Å or less.

25. The method of claim 24, wherein the tungsten bulk layer has a thickness in a range from about 300 Å to about 1,500 Å.

26. A method of forming a composite tungsten film, comprising:
   introducing a substrate having at least one aperture into a first process environment;
   providing a tungsten-containing precursor to the first process environment;
   adsorbing the tungsten-containing precursor on the substrate;
   providing a reducing gas to the first process environment;
   adsorbing the reducing gas onto the substrate, wherein a tungsten nucleation layer is formed on the substrate including within the at least one aperture;
   repeating the providing and adsorbing steps until the tungsten nucleation layer is formed with a desired thickness; and
   forming a tungsten bulk layer on the tungsten nucleation layer within the at least one aperture, wherein the tungsten bulk layer is formed by a chemical vapor depositing process comprising:

providing the substrate with a second process environment;

providing a flow of a tungsten-containing compound into the second process environment;

thermally decomposing the tungsten-containing compound to form the tungsten bulk layer; and filling the at least one aperture with the tungsten bulk layer free of voids and seams.

27. The method of claim 26, wherein the tungsten-containing precursor is tungsten hexafluoride or tungsten carbonyl.

28. The method of claim 27, wherein the tungsten-containing precursor is provided at a flow in a range rate from about 10 sccm to about 400 sccm.

29. A method of forming a composite tungsten film, comprising:

introducing a substrate having at least one aperture into a first process environment;

providing a tungsten-containing precursor to the first process environment;

adsorbing the tungsten-containing precursor on the substrate;

purging the first process environment;

providing a reducing gas to the first process environment to form a tungsten nucleation layer on the substrate including within the at least one aperture;

purging the first process environment;

removing the substrate from the first process environment after forming the tungsten nucleation layer to a desired thickness;

providing the substrate to a second process environment; and depositing a tungsten bulk layer on the tungsten nucleation layer to fill the at least one aperture free of voids and seams by exposing the substrate to a continuous flow of a process gas containing a second tungsten-containing precursor.

30. The method of claim 29, wherein the tungsten-containing precursor is tungsten hexafluoride or tungsten carbonyl.

31. The method of claim 30, wherein the tungsten-containing precursor is provided at a flow rate in a range from about 10 sccm to about 400 sccm.

32. The method of claim 29, wherein the reducing gas is selected from the group consisting of silane, disilane, dichlorosilane, borane, diborane, triborane, tetraborane, and pentaborane.

33. The method of claim 32, wherein the reducing gas is diborane.

34. The method of claim 33, wherein the diborane is provided at a flow rate in a range from about 5 sccm to about 150 sccm.

35. The method of claim 32, wherein the reducing gas is silane.

36. The method of claim 35, wherein the silane is provided at a flow rate in a range from about 10 sccm to about 500 sccm.

37. The method of claim 32, wherein the reducing gas is provided at a duration of less than 0.2 seconds.

38. The method of claim 29, further comprising flowing a carrier gas through the first process environment.

39. The method of claim 38, wherein the carrier gas is selected from the group consisting of helium, argon, nitrogen or hydrogen.

40. The method of claim 39, wherein the carrier gas is provided at a flow rate in a range from about 250 sccm to about 1,000 sccm.

41. The method of claim 29, wherein the desired thickness of the tungsten nucleation layer is about 100 Å or less.

42. The method of claim 41, wherein the tungsten bulk layer has a thickness in a range from about 300 Å to about 1,500 Å.

43. A method of forming a composite tungsten film, comprising:

positioning a substrate having at least one aperture into a process chamber;

forming a nucleation layer on the substrate and within the at least one aperture by a cyclic deposition process comprising subsequently exposing the substrate to a tungsten-containing precursor and a reducing gas;

forming a tungsten bulk layer on the nucleation layer within the at least one aperture by a chemical vapor deposition process, comprising:

maintaining the substrate within a temperature range to thermally deposit the tungsten bulk layer;

exposing the substrate to a steady flow of a process gas containing a second tungsten-containing precursor; and depositing the tungsten bulk layer to fill the at least one aperture free of voids and seams.

44. The method of claim 43, wherein the tungsten-containing precursor is tungsten hexafluoride or tungsten carbonyl.

45. The method of claim 44, wherein the tungsten-containing precursor is provided at a flow rate in a range from about 10 sccm to about 400 sccm.

46. The method of claim 45, wherein the tungsten-containing precursor is pulsed at a duration of less than 1 second.

47. The method of claim 46, wherein the duration is less than 0.2 seconds.

48. The method of claim 43, wherein the reducing gas is selected from the group consisting of silane, disilane, dichlorosilane, borane, diborane, triborane, tetraborane, and pentaborane.

49. The method of claim 48, wherein the reducing gas is diborane.

50. The method of claim 49, wherein the diborane is provided at a flow rate in a range from about 5 sccm to about 150 sccm.

51. The method of claim 48, wherein the reducing gas is silane.

52. The method of claim 51, wherein the silane is provided at a flow rate in a range from about 10 sccm to about 500 sccm.

53. The method of claim 43, wherein the reducing gas is provided at a duration of less than 1 second.

54. The method of claim 43, further comprising flowing a carrier gas through the first process chamber during the cyclic deposition process.

55. The method of claim 54, wherein the carrier gas is selected from the group consisting of helium, argon, nitrogen or hydrogen.

56. The method of claim 55, wherein the substrate is maintained at a temperature in a range from about 200° C. to about 500° C.

57. The method of claim 55, wherein the process chamber comprises a pressure in a range from about 1 Torr to about 10 Torr.

58. The method of claim 43, wherein the substrate is maintained at a temperature in a range from about 450° C. to about 600° C. during the chemical vapor deposition process.

59. The method of claim 58, wherein the second tungsten-containing precursor is tungsten hexafluoride or tungsten carbonyl.

60. The method of claim 43, wherein the desired thickness of the nucleation layer is about 100 Å or less.

61. The method of claim 60, wherein the tungsten bulk layer has a thickness in a range from about 300 Å to about 1,500 Å.

* * * * *

UNITED STATES PATENT AND TRADEMARK OFFICE
CERTIFICATE OF CORRECTION

PATENT NO. : 6,939,804 B2  Page 1 of 1
APPLICATION NO. : 10/299212
DATED : September 6, 2005
INVENTOR(S) : Ken K. Lai et al.

It is certified that error appears in the above-identified patent and that said Letters Patent is hereby corrected as shown below:

Column 6, Line 64: Change "dichiorosilane" to --dichlorosilane--

In the Claims

Column 12, Claim 6, Line 3: Change "dichiorosilane" to --dichlorosilane--

Column 13, Claim 28, Line 15: Change "in a range rate" to --rate in a range--

Column 13, Claim 32, Line 49: Change "dichiorosilane" to --dichlorosilane--

Column 14, Claim 54, Line 53: Delete "first"

Signed and Sealed this

Twenty-ninth Day of August, 2006

JON W. DUDAS
*Director of the United States Patent and Trademark Office*